March 29, 1960 R. GALLETTI 2,930,993
OSCILLATOR TUNED AUTOMATICALLY TO MATCH CRYSTAL FREQUENCY
Filed Nov. 25, 1955
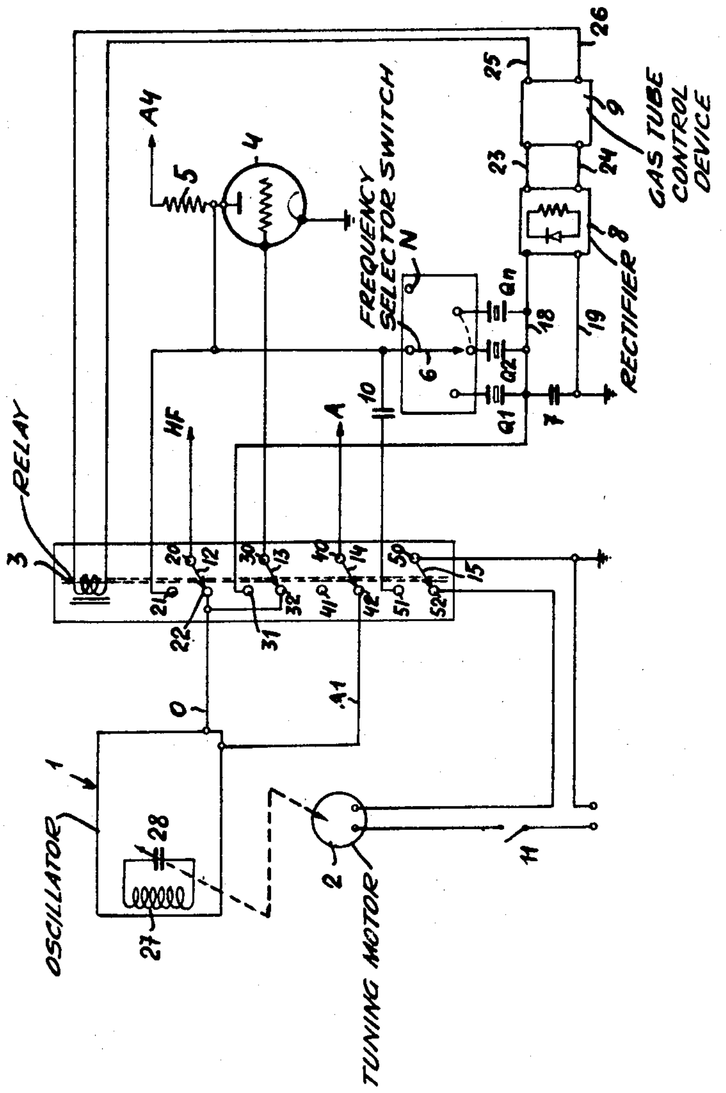

United States Patent Office 2,930,993

Patented Mar. 29, 1960

2,930,993

OSCILLATOR TUNED AUTOMATICALLY TO MATCH CRYSTAL FREQUENCY

Remo Galletti, Genoa-Pegli, Italy, assignor to Marconi Italianna S.p.A., Genoa, Italy, an Italian company Application November 25, 1955, Serial No. 549,089

6 Claims. (Cl. 331—177)

When a radio transmitter or receiver is required to transmit or to receive a limited number of predetermined frequencies, there is an advantage in replacing the ordinary tunable oscillator by an oscillator having a precision fixed-frequency resonant circuit and preferably a crystal oscillator of suitable frequency, whereby a switch or push-button can be used to change the crystal connected in the circuit, in order to select among several frequencies.

In this way it is possible to obtain fixed-frequency oscillator and preferably crystal oscillator frequency stability in transmitter and receiver operation, with the resulting assurance that the transmitter or receiver will be always correctly tuned to the desired frequency. Fixed frequency-controlled and particularly crystal-controlled transmitters and receivers find extensive use particularly in mobile equipment, where it is necessary to guard one of a limited number of channels and always be in correct adjustment to transmit or to receive any call that may come over it.

However the changing of the tuning of the receiver to a different fixed resonant circuit or crystal-controlled frequency in conventional sets is by no way rapid and easy, particularly if remote control is required, and is possible only over a limited number of fixed positions of the variable tuning members.

The invention, to the contrary, provides simple means for rapidly and automatically selecting the required frequency among a number of predetermined frequencies whereby this selection is preferably effected by a motor which drives the tuning means and is automatically stopped when said means are tuned to the same frequency of the fixed predetermined frequency or crystal-controlled circuit, which is then substituted to the tunable oscillator.

The advantages of the motor-controlling the tuning system according to the invention reside not only in the very high precision of tuning of the set to any of a number of predetermined frequencies, but also in the feature that the tuning to another of the said predetermined frequencies or even to other frequencies within the tuning range of the tunable oscillator is effected by simply switching or substituting a new crystal, or a new fixed resonant circuit, which acts on the tuning motor so as to cause same to be stopped as soon as the tuning circuits are set to the same frequency of the fixed-frequency or crystal oscillator, which then substitutes the tunable oscillator. This renders further remote control of the set very easy.

A schematic diagram of parts of the circuits of an apparatus according to the invention is shown, on the attached drawing, relating to crystal oscillators.

1 indicates diagrammatically a usual vacuum tube tunable oscillator (of which only the adjustable resonant circuit 27—28 is shown) the variable condenser 28 of which can be set to the required capacitance either by hand (in which case the motor switch 11 is open and the set is tuned by hand as usual) or automatically, to one of a number of predetermined frequencies, by means of the motor 2 through the usual speed-down gear, clutch and/or braking means which are usually adopted in like cases and therefore do not form part of the invention. A1 indicates the anode feed line of the electronic tube of the tunable oscillator 1 and 0 is its high-frequency output.

The oscillator output O is connected to a contact 22 of a two-way switch 12 the other contact 21 of which is connected to the anode of a crystal oscillator tube 4 to which the anode current is fed by line A4 through a resistor 5. The switch terminal 20 is connected to the high-frequency line HF connected to the other stages of the set.

A branch line of the oscillator output is connected to a contact 32 of a two-way switch 13 which is connected through the terminal 30 to the control grid of said oscillator tube 4. The other contact 31 of this switch 13 is connected with one of the poles of a number of piezoelectric crystals Q1, Q2 . . . Q*n* connected in parallel to line 18 and connected to the ground through a capacitance 7 while the other pole of either of said crystals may be connected through a switch 6 with the anode of said oscillator tube 4 and, through a capacitance 10, with the pole 51 connected to the ground of another two-way switch 15, the whole forming an oscillator. This switch, when closed over the contact 52 closes the feed circuit of the motor 2, provided the other control switch 11 be closed.

This anode feed A1 of the tube of the oscillator 1 is connected to a contact 42 of a switch 14 connected through the pole 40 to the anode current supply line A. This switch, which is shown as a two-way switch, like the others 12, 13 and 15 just described, may be a simple switch, as the other contact 41 is insulated.

To the line 18 connected to one of the terminals of the piezoelectric crystals and a grounded conductor 19 is connected a rectifier 8 the output 23—24 of which is connected to a control device 9, which might be a gas tube, such as grid-controlled gas triode which is passed by a suitably strong anode current whenever a sufficiently high voltage is set up at said rectifier output. This anode current is led through and energizes an electromechanical relay 3 whose armature is connected to the movable arms of said switches 12, 13, 14 and 15. These arms, which are electrically connected with the poles 20, 30, 40 and 50, are then shifted from the contact positions 22, 32, 42 and 52 to the contact positions 21, 31, 41 and 51.

The operation is as follows:

When the motor switch 11 is open with the switches 12, 13, 14, 15 in the position as shown in the drawing and the crystal switch is in its idle position N, the transmitting or receiving set functions with the usual tunable resonant circuit 27—28 as frequency control. Then the tube 4 acts as radio-frequency amplifier, as its control grid is connected to the output O of the tunable oscillator 1 through the contact 32 of the switch 13.

When however one of the frequency-control crystals Q1 . . . Q*n* comes to be connected to the anode of the tube 4 through the switch 6 and the motor 2 is started by closing the switch 11, the rotor of the capacitor 28 of the resonant circuit 27—28 is rotated until the resonant value of the piezoelectric crystal which has been inserted has been reached. At that moment, a voltage is generated at the terminals of the capacitance 7. This voltage is rectified at 8 and is sent to the gas tube control 9 which causes a current to flow through the relay 3 which, being energized, attracts its armature and shifts the switches 12, 13, 14 and 15 from the position as shown, to the position in which the arms of said switches snap into contact with the contacts 21, 31, 41 and 51.

In this manner the tunable oscillator 1 is entirely disconnected from all circuits at 22, 32 and 42 and thus has no influence on the tuned frequency of the oscillator, the frequency of which is controlled exclusively by the pre-set fixed-frequency crystal Q2 (in the case shown in the drawing) which is connected on one side through contact 31 of switch 30 with the control grid of tube 4 and on the other side, connected to the anode of tube 4, with the high-frequency circuit H through contact 21 of switch 20.

On the other hand the motor 2 is immediately stopped, as its feed line is interrupted at 52 and at the same time, due to the shifting of the switches 12 and 13 on the contacts 21 and 31, the pre-set crystal comes to be inserted between the grid and the plate of the tube 4 constituting a feedback connection. The tube 4 thus acts as oscillator working at the frequency of the said crystal. At the same time the tunable oscillator 1 ceases its working, due to the interruption of the anode current feed at 42. The capacitance 10, connected with one terminal of the crystal, like the capacitance 7 connected with the other crystal terminal, are both connected to the ground.

Of course, the invention may undergo numerous changes without departing from the scope thereof. Thus, instead of piezoelectric crystals, a number of resonant circuits exactly tuned to the required frequencies may be employed, so as to provide a feedback between the output and the input of the tube 4. This arrangement might be preferred in case of short wave transmitters or receivers. If however even in these cases it is deemed preferable to employ crystal oscillators, these will be followed in a known manner by frequency multipliers.

The utility of the system resides in this, that all the circuits of the set—and not the tunable oscillator only—are automatically tuned to the quartz frequency, for example by means of a gang condenser or variometer. When the tuning is completed, the quartz is switched off the tuning-controlling device and is automatically inserted into the circuit of the "free" oscillator, which includes tube 4 and which thus functions as a quartz oscillator.

From the foregoing it is apparent that the possibility has been given of very exactly tuning a radio set including an oscillator to a number of preselected frequencies, by tuning, possibly by means of a motor, a resonant circuit of a tunable oscillator to the same frequency or even to one of its harmonics, of one of a number of fixed resonant circuits which substitute the said resonant circuit of the tunable oscillator.

This renders it very easy to distant control the radio set and even to substitute or switch on and off any of the crysals or other fixed resonant means.

I claim:

1. A frequency control apparatus comprising a tunable resonant circuit, a tunable oscillator in said circuit, a movable tuning member in said circuit, driving means for moving said movable tuning member to vary the frequency of said tunable oscillator, a fixed frequency oscillator having at least one fixed frequency resonant means, means responsive to the syntony between said tunable resonant circuit and said fixed frequency resonant means for generating an electrical pulse, and relay means energized by such electrical pulse for switching off said tunable oscillator and for switching on said fixed frequency oscillator, whereby said fixed frequency oscillator may be substituted for said tunable oscillator.

2. A frequency control apparatus according to claim 1, wherein an electrical connection is provided between said relay and said driving means for stopping said driving means when said relay is energized by the electrical pulse.

3. A frequency control apparatus according to claim 1, wherein said fixed frequency oscillator comprises a high frequency amplifier tube whose anode is connected to one terminal of said fixed resonant means and whose grid is connected to the output of said tunable oscillator, wherein a rectifier is connected to the other terminal of said fixed frequency resonant means for rectifying said pulse, and wherein a gas tube is connected to the output of said rectifier and to said relay means to energize said relay means to switch off said grid from said tunable oscillator and switch on said fixed frequency resonant means to said amplifier tube to act as a fixed frequency oscillator.

4. A frequency control apparatus according to claim 3, wherein said relay means comprises an electromechanical relay connected to four switches, each having a first position when said relay is de-energized and a second position when said relay is energized, one of said switches in its first position connecting the output of said tunable resonant circuit with the subsequent high-frequency stage of the apparatus by-passing said amplifier tube and in its second position connects the anode of said amplifier tube with one end of said fixed-frequency resonant means, another of said switches in its first position connecting the output of said tunable resonant circuit with the grid of said amplifier tube and in its second position connecting the grid of said amplifier tube with the other end of said fixed frequency resonant means, a third of said switches in its first position connecting said tunable resonant circuit with the anode current feed of said amplifier tube and in its second position being open, and the fourth of said switches in its first position closing the feed circuit of an electric motor constituting said driving means and in its second position opening such feed circuit.

5. A frequency control apparatus according to claim 4, wherein said fixed frequency resonant means is a conventional fixed frequency circuit.

6. A frequency control apparatus according to claim 4, wherein said fixed frequency resonant means comprises a piezo-electric crystal.

References Cited in the file of this patent

UNITED STATES PATENTS

| | | |
|---|---|---|
| 2,445,663 | Doelz | July 20, 1948 |
| 2,499,875 | Pifer | Mar. 7, 1950 |
| 2,524,281 | Winfield | Oct. 3, 1950 |
| 2,568,412 | Robinson | Sept. 18, 1951 |
| 2,617,985 | Collins | Nov. 11, 1952 |